(12) United States Patent
Cheng

(10) Patent No.: US 7,454,604 B2
(45) Date of Patent: Nov. 18, 2008

(54) REUSABLE HARDWARE IP PROTOCOL METHOD FOR A SYSTEM-ON-CHIP DEVICE

(75) Inventor: Fu-Chiung Cheng, Taipei (TW)

(73) Assignee: Tatung Co., Ltd., Taipei (TW)

( * ) Notice: Subject to any disclaimer, the term of this patent is extended or adjusted under 35 U.S.C. 154(b) by 906 days.

(21) Appl. No.: 10/851,098

(22) Filed: May 24, 2004

(65) Prior Publication Data
US 2005/0086458 A1  Apr. 21, 2005

(30) Foreign Application Priority Data
Jul. 23, 2003  (TW) ................ 92120124 A

(51) Int. Cl.
*G06F 9/00* (2006.01)

(52) U.S. Cl. ................ 713/1; 713/2; 713/100

(58) Field of Classification Search ............ 713/1, 713/100, 2
See application file for complete search history.

(56) References Cited

U.S. PATENT DOCUMENTS

| 6,073,267 | A | * | 6/2000 | Sasaki | 714/799 |
| 2002/0101257 | A1 | * | 8/2002 | Kawahara et al. | 326/38 |
| 2004/0024895 | A1 | * | 2/2004 | Henrion | 709/230 |
| 2004/0098701 | A1 | * | 5/2004 | Klein | 716/18 |

* cited by examiner

*Primary Examiner*—Tse Chen
(74) *Attorney, Agent, or Firm*—Bacon & Thomas, PLLC

(57) ABSTRACT

A reusable hardware intellectual property (IP) component protocol method for a system-on-chip is disclosed, which uses a software function to describe hardware behavior. A calling of the software corresponds to hardware IP component's execution, and the procedure of the software function corresponds to the behavior of the hardware IP. Therefore, the hardware IP can be reused as a software function.

9 Claims, 2 Drawing Sheets

REUSABLE HARDWARE IP PROTOCOL METHOD FOR A SYSTEM-ON-CHIP DEVICE

BACKGROUND OF THE INVENTION

1. Field of the Invention

The present invention relates to a protocol method for a system-on-chip device and, more particularly, to a reusable hardware IP protocol method for a system-on-chip device.

2. Description of the Related Art

System-on-chip designs have become an important trend in current circuit designs, integrating several functionally related circuit blocks into one chip. Taking a system-on-chip microprocessor in the field of computing as an example, the system-on-chip's internal circuitry integrates the circuit blocks of a CPU, a chip set, and a graphical chip, so that the system-on-chip microprocessor contains the functionality of all three circuit blocks. The system-on-chip design not only reduces manufacturing costs but also reduces the total circuit area to reduce the entire circuit size. Each circuit block is composed of several different circuit modules, which may include counters, adders, coders, decoders, etc., that are known as hardware IP (Intellectual Property). The system-on-chip design uses hardware IPs to build the required circuit blocks, and then integrates the circuit blocks together into a single chip.

However, there are some problems with the system-on-chip design. The most important one is clock frequency control among the different hardware IP components. A clock frequency signal is used for controlling an operating speed of each hardware IP component in the system-on-chip. When the clock frequency signal is sent to every circuit block in the system-on-chip, all the hardware IP components in the circuit block will operate at the same frequency. Since every hardware IP component has its individual operating frequency, in order to enable several hardware IP components to operate in a single clock frequency, the clock frequency signal must satisfy the slowest clock frequency to avoid incorrect timing. However, this reduces the overall system efficiency.

Therefore, it is desirable to provide a reusable hardware IP component protocol method for a system-on-chip to mitigate and/or obviate the aforementioned problems.

SUMMARY OF THE INVENTION

A main objective of the present invention is to provide a reusable hardware IP component protocol method for a system-on-chip that can describe hardware behavior by software functions.

Another objective of the present invention is to provide a reusable hardware IP component protocol method for a system-on-chip that can be reused many times.

Another objective of the present invention is to provide a reusable hardware IP component protocol method for a system-on-chip that can be used in asynchronous circuit designs.

In order to achieve the above mentioned objectives, the present invention discloses a reusable hardware IP component protocol method for a system-on-chip, the method includes: (A) determining whether any parameters are needed, corresponding to a determination step of whether the hardware module needs any parameters; wherein if parameters are needed, proceeding to step (B), and if not, proceeding to step (C); (B) inputting at least one functional parameter, corresponding to an inputting step of the hardware module for at least one functional data parameter; (C) calling a software function that corresponds to a signal requesting step of the hardware module; (D) waiting for a return value from the software function corresponding to an acknowledge signal waiting step of the hardware module; (E) sending back the return value from the software function corresponding to an outputting result data step of the hardware module; and (F) ending the software function corresponding to a hardware reset step of the hardware module.

Finally, the software function is utilized to generate hardware description language, and the hardware description language is utilized to generate hardware IP components. The system-on-chip is designed for at least one hardware module, and the hardware module performs asynchronously. The software function of the present invention can be used to describe the hardware performance and be used for both synchronous and asynchronous circuit designs to achieve the objectives of the present invention.

Other objects, advantages, and novel features of the invention will become more apparent from the following detailed description when taken in conjunction with the accompanying drawings.

DETAILED DESCRIPTION OF THE PREFERRED EMBODIMENT

Figure 2:
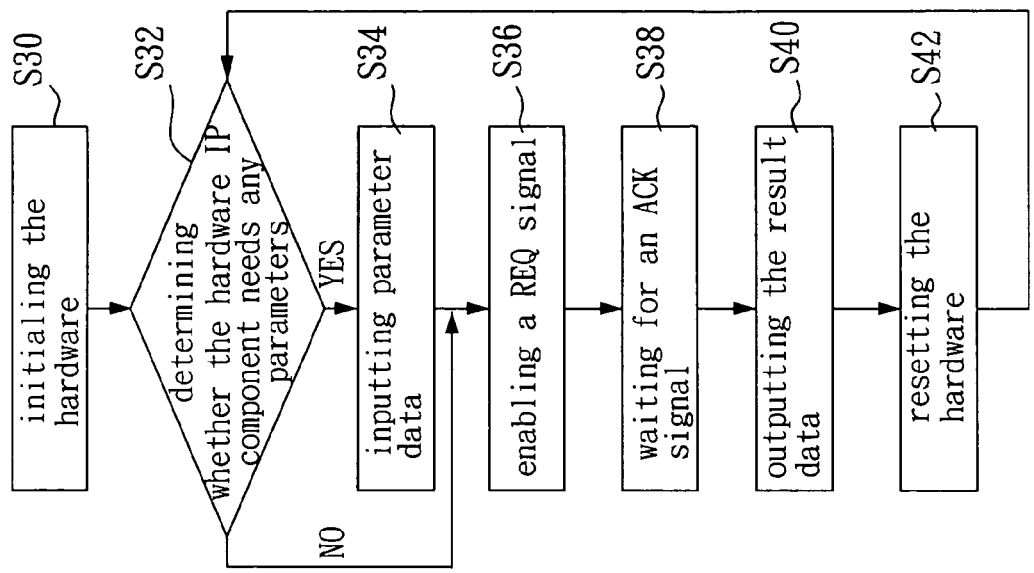
FIG. 2 is a flowchart of hardware IP component performance corresponding to FIG. 1.
Figure 1:
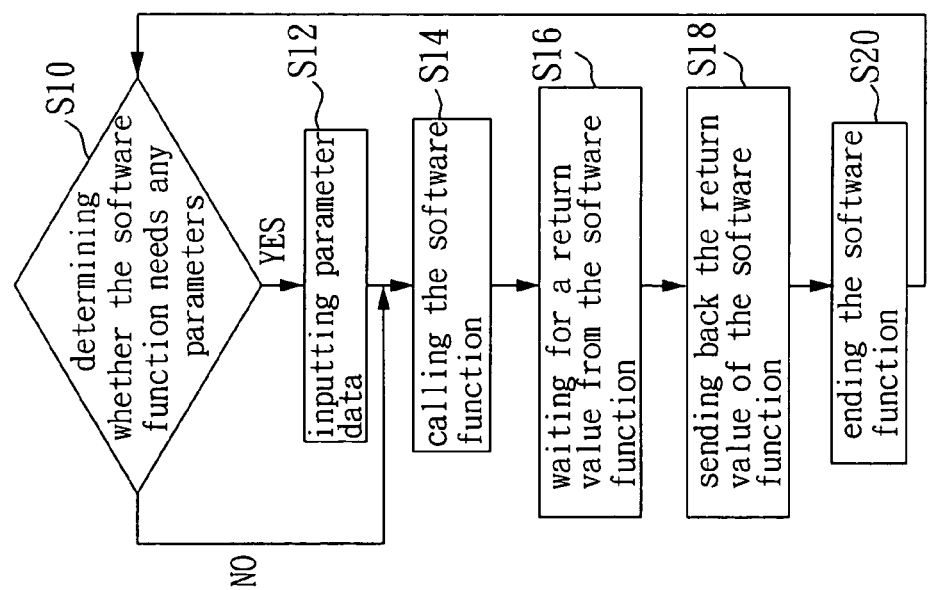
FIG. 1 is a software flowchart of a reusable hardware IP component protocol method for a system-on-chip according to the present invention.
Figure 3:
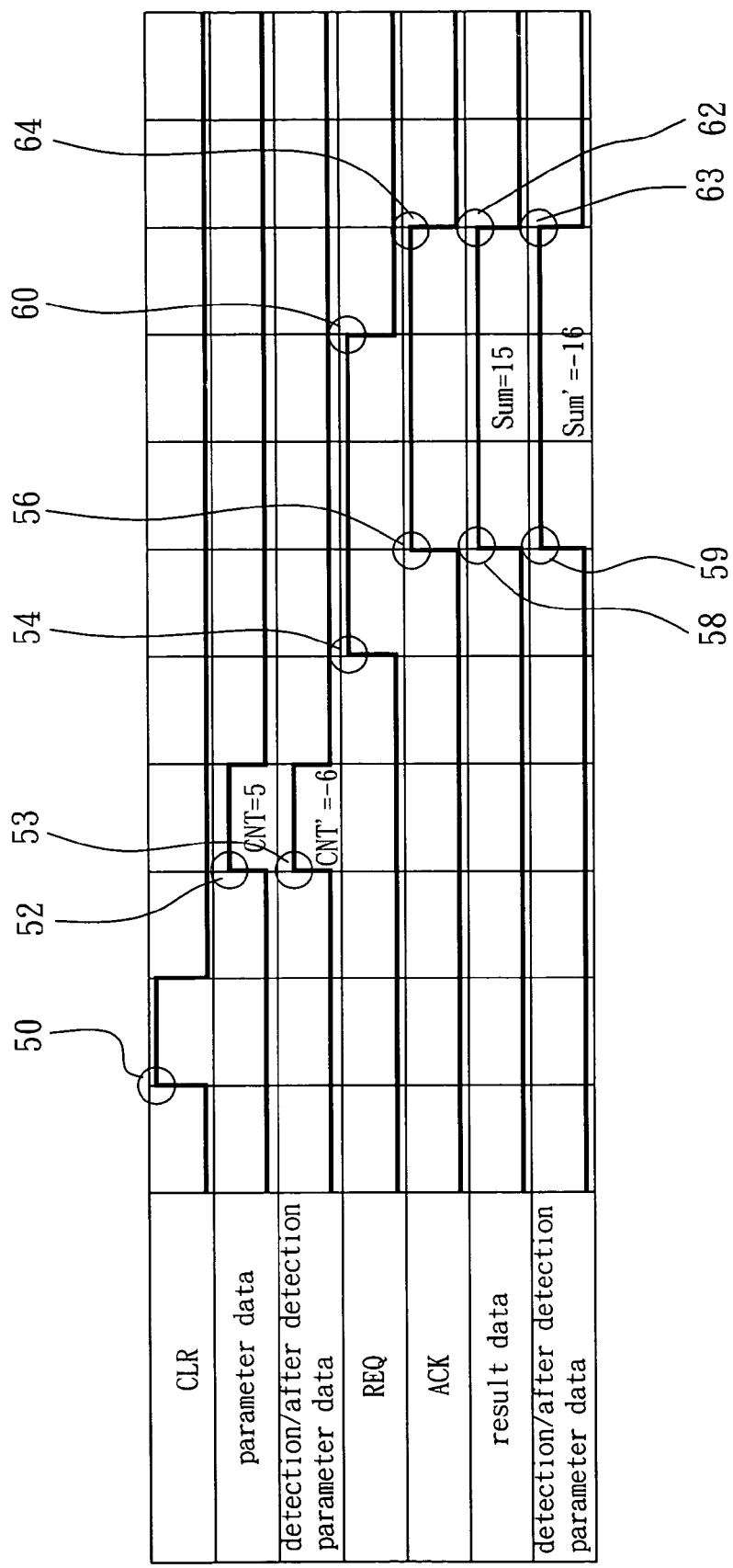
FIG. 3 is a schematic drawing of the hardware IP component's performance.

FIG. 1 shows a software flowchart of a reusable hardware IP component protocol method for a system-on-chip according to the present invention. The method of the present invention uses a software function to describe hardware IP component's behavior, and calls the software module to correspond to execution of the hardware IP component. Please refer to FIG. 1, FIG. 2 and FIG. 3. FIG. 2 is a flowchart of hardware IP component's behavior corresponding to FIG. 1. FIG. 3 shows the timing diagram of the hardware IP component's behavior. As shown in FIG. 1, a procedure of the method of the present invention includes:

Step 10: determining whether the software function needs any parameters; if needed, step 12 is performed; if not, step 14 is performed. The software function can be the following accumulation function (1), but is not limited to this function:

```
public static int sumTo(int CNT)      --(1)
{
    int SUM = 0 ;
    for(int i =1 ; i <= CNT ; i ++)
    {
        SUM += i ;
    }
    return SUM ;
}
```

Before calling the function (1), a function parameter needs to be set and input, for example setting the function parameter CNT to 5.

As well known, when the hardware IP component resets or boots, step 30 is always executed to initialize the hardware for any subsequent execution. Moreover, the hardware operation of step 30 is shown at a rising edge 50 of a CLR signal in FIG.

3, which means that the CLR signal is set as the high state to remove any data temporarily stored in the hardware IP components.

Step 10 for the software function corresponds to step 32 for the hardware IP component, wherein step 32 is executed to determine whether the hardware IP component needs any parameters, and if yes, step 34 is executed to input parameter data, to correspond to step 12. If step 32 determines that no hardware IP component is required, step 36 is executed to enable a request signal, to correspond to step 14. The hardware operation of step 34 is shown as a rising edge 52 of the parameter data in FIG. 3, which means an external circuit (the circuit connected to the hardware IP component) inputs parameter data (such as the above-mentioned CNT=5) into the hardware IP component. The external circuit can also receive the acknowledge signal of receiving the input data from the hardware IP component.

Step 14 is executed to call the software function. For the function (1), after step 12, the software should be executed. Step 14 executes the following code:

```
int SUM = 0;
for(int i = 1; i <= CNT; i ++)
{
    SUM += i;
}
```

Furthermore, step 14 corresponds to step 36 in FIG. 2, which is executed to enable a request (REQ) signal. The REQ signal at a high state is input from the external circuit to the hardware IP component, and the hardware IP component executes an internal circuit operation (corresponding to step 14) according to functional settings and the input parameter and generates an appropriate response (the outputting result of step 14). Step 36 is shown as a rising edge 54 in FIG. 3, which means the external circuit sets the REQ signal with a high state, and then the internal circuit in the hardware IP component begins to operate.

Step 16 is executed to wait for a return value from the software function. For the function (1), when the parameter is provided (in step 12), and has undergone execution (in step 16), the function (1) will send back a resultant value (or a return value).

Furthermore, step 16 corresponds to step 38 in FIG. 2, which is executed to wait for an acknowledgment (ACK) signal. After the hardware IP component has executed its appropriate operation, the resultant value is generated by the hardware IP component and output to the external circuit. The ACK signal is sent from the hardware IP to the external circuit indicating the resultant value is being produced. The hardware IP component then is ready to output the resultant value to the external circuit. Step 38 is shown as a rising edge 56 of the ACK signal in FIG. 3, wherein when the hardware IP raises the ACK signal from a low state to a high state, the hardware IP component completes the requested operation and output the result value to the external circuit.

Step 18 is executed to send back the return value of the software function. After the function (1) has finished operation, the return value is sent back. Since the CNT parameter is 5, the function (1) runs and results a SUM parameter of 15, and sends the SUM parameter back. Step 18 corresponds to step 40 in FIG. 2, which is executed to output the resultant data. When the REQ signal and the ACK signal are both set to the high state, the hardware IP component outputs the resultant value of the operation to the external circuit, i.e. outputs the resultant data 15. Step 40 is shown as a rising edge 58 of the result data in FIG. 3, which indicates outputting of the result data 15.

Step 20 is executed to end the software function. After the function (1) sends back the return value, the function (1) has finished its task and the function can be called again. Step 20 corresponds to step 42 shown in FIG. 2, which is executed to reset the hardware. After receiving the resultant data, the external circuit sets the REQ signal to the low state, so that the IP component can clear temporary stored data and is ready to the next call. Step 42 is shown as a descending edge 60 REQ signal in FIG. 3. When the REQ signal is at a low state, the hardware IP component stops outputting the resultant data and removes all the resultant data in the hardware IP component, as indicated by a descending edge 62 of a data signal shown in FIG. 3. When the ACK signal is at the low state that indicates the resultant data has been removed completely, as indicated by a descending edge 64 of the ACK signal shown in FIG. 3, the hardware IP component is ready for a subsequent operation.

In addition, when inputting the parameter and outputting the resultant data, a double-check data representation is used to assure that output/input procedures have been completed, as well as execution of an error detection means. As in step 34, while inputting the parameter data, completion-detection or error-detection (CDED) parameter data is also input at the same time by using, for example, a complement technique (also used in step 40) which determines if the sum of the parameter data with the CDED parameter data equals −1. However, there are many other error detecting methods that can be used. When the parameter data is input as CNT=5, the CDED parameter is input as CNT'=−6, and its hardware execution is shown as a rising edge 53 of the CDED parameter data in FIG. 3; when the result data is output as SUM=15, the detection/after-detection parameter data is output as SUM'=−16, and its hardware execution is shown as a rising edge 59 of the CDED parameter data in FIG. 3. Therefore, the correctness of data transmission is well assured.

The software function of this embodiment can be used to indicate the hardware IP component's performance or operation; and the software function can be repeatedly called, which means the hardware IP component can repeat the operation. Thus, the software function can be transformed into a practical hardware structure. For example, the software function can be transformed into a well-known VHSIC (Very High Speed Integrated Circuits) Hardware Description Language (VHDL), and the VHDL is then transformed into a practical hardware structure. In other words, the software function can describe the hardware's performance. Furthermore, when the system-on-chip is designed to have more than one software function, since the hardware IP component corresponding to the software function is implemented in accordance with the above-mentioned steps and irrelevant to clock frequency, the different hardware IP components can have different clock frequencies. Therefore, the hardware IP component can perform correctly in either synchronous or asynchronous system-on-chip designs.

Although the present invention has been explained in relation to its preferred embodiment, it is to be understood that many other possible modifications and variations can be made without departing from the spirit and scope of the invention as hereinafter claimed.

What is claimed is:

1. A reusable hardware intellectual property (IP) protocol method for a system-on-chip device, describing a hardware behavior via a software function, the method comprising: (A) determining whether any parameters are needed, corresponding to a determination of whether a hardware IP needs any parameters; wherein if parameters are needed, proceeding to step (B), and if not, proceeding to step (C); (B) inputting at least one function parameter, corresponding to inputting at least one hardware function parameter to the hardware IP; (C) calling the software function corresponding to inputting a request signal to the hardware IP; (D) waiting for a return value from the software function corresponding to waiting for an acknowledge signal from the hardware IP; (E) sending back the return value from the software function corresponding to outputting a result data from the hardware IP when the request signal and the acknowledge signal are enabled; and (F) ending the software function corresponding to resetting or booting the hardware IP.

2. The method as claimed in claim 1, further comprising, before step (A), a hardware initialization step to initialize the hardware IP.

3. The method as claimed in claim 1, wherein step (B) further comprises an input of at least one detecting data that corresponds to the at least one hardware function parameter.

4. The method as claimed in claim 3, wherein the at least one detecting data is a complement number of the at least one hardware function parameter.

5. The method as claimed in claim 4, wherein the at least one detecting data is used for detecting whether the at least one hardware function parameter is incorrect, or for detecting whether the at least one hardware function parameter is input completely.

6. The method as claimed in claim 1, wherein step (E) further comprises an output of a completion signal from the hardware IP, and the at completion signal corresponds to resultant data.

7. The method as claimed in claim 6, wherein the completion signal is a complement number of the result data.

8. The method as claimed in claim 4, wherein at least one detecting resultant data is used for detecting whether the completion signal is incorrect, or for detecting whether at least one result data is input completely.

9. The method as claimed in claim 1, wherein the software function can be transformed into a hardware description language.

\* \* \* \* \*